(12) United States Patent
Bauer et al.

(10) Patent No.: US 10,882,135 B2
(45) Date of Patent: Jan. 5, 2021

(54) APPARATUS FOR ADDITIVELY MANUFACTURING OF THREE-DIMENSIONAL OBJECTS

(71) Applicant: CONCEPT LASER GMBH, Lichtenfels (DE)

(72) Inventors: Maximilian Bauer, Kulmbach (DE); Kai Hertel, Breitengüßbach (DE)

(73) Assignee: Concept Laser GmbH, Lichtenfels (DE)

( * ) Notice: Subject to any disclaimer, the term of this patent is extended or adjusted under 35 U.S.C. 154(b) by 0 days.

(21) Appl. No.: 16/041,607

(22) Filed: Jul. 20, 2018

(65) Prior Publication Data
US 2019/0022795 A1 Jan. 24, 2019

(30) Foreign Application Priority Data
Jul. 21, 2017 (EP) ..................................... 17182638

(51) Int. Cl.
*B29C 64/286* (2017.01)
*B23K 26/04* (2014.01)
(Continued)

(52) U.S. Cl.
CPC .......... *B23K 26/048* (2013.01); *B22F 3/1055* (2013.01); *B29C 64/153* (2017.08);
(Continued)

(58) Field of Classification Search
CPC ... B29C 64/153; B29C 64/268; B29C 64/393; B29C 64/188; B29C 64/00; B29C 64/10;
(Continued)

(56) References Cited

U.S. PATENT DOCUMENTS 6,646,728 B1 * 11/2003 Tang ..................... G01J 1/4257
356/122
8,577,212 B2 * 11/2013 Thiel .................... A61B 5/0068
348/46
(Continued)

FOREIGN PATENT DOCUMENTS

CN 105965015 A 9/2016
CN 206030585 U 3/2017
(Continued)

OTHER PUBLICATIONS

European Search Opinion Corresponding to Application No. 17182638 dated Jan. 18, 2018.
(Continued)

*Primary Examiner* — Hoa Q Pham
(74) *Attorney, Agent, or Firm* — Dority & Manning, P.A.

(57) ABSTRACT

An apparatus for additively manufacturing three-dimensional objects includes a scanning unit configured to scan an energy beam over a build plane, and a focusing unit that includes an optical lens or lens system. The focusing unit may be configured to control a focal position of the energy beam based on calibration information. The focal position may be controlled by moving the focusing unit in the z-direction relative to the build plane without changing the focal length of the energy beam. Methods of calibrating such an apparatus may include moving a focusing unit in the z-direction relative to a build plane based on calibration information and scanning an energy beam over at least a portion of the build plane using a scanning unit, with the focusing unit being configured to control a focal position of the energy beam without changing the focal length of the energy beam.

19 Claims, 1 Drawing Sheet

(51) Int. Cl.

| | |
|---|---|
| *B29C 64/393* | (2017.01) |
| *B33Y 40/00* | (2020.01) |
| *B33Y 50/02* | (2015.01) |
| *G03F 7/20* | (2006.01) |
| *B29C 64/30* | (2017.01) |
| *B29C 64/153* | (2017.01) |
| *B29C 64/245* | (2017.01) |
| *B29C 64/268* | (2017.01) |
| *B22F 3/105* | (2006.01) |
| *B33Y 10/00* | (2015.01) |
| *B33Y 30/00* | (2015.01) |

(52) U.S. Cl.
CPC .......... *B29C 64/245* (2017.08); *B29C 64/268* (2017.08); *B29C 64/30* (2017.08); *B29C 64/393* (2017.08); *B33Y 40/00* (2014.12); *B33Y 50/02* (2014.12); *G03F 7/70416* (2013.01); *B22F 2003/1056* (2013.01); *B22F 2003/1058* (2013.01); *B33Y 10/00* (2014.12); *B33Y 30/00* (2014.12)

(58) Field of Classification Search
CPC .... G29C 64/245; B22F 3/1055; B22F 1/0003; B22F 3/16; B23K 26/048; B33Y 10/00; B33Y 30/00; B33Y 50/02; B33Y 80/00; G01N 21/274
USPC .......................... 356/601–623, 243.1, 243.4
See application file for complete search history.

(56) References Cited

U.S. PATENT DOCUMENTS

| | | | | |
|---|---|---|---|---|
| 10,583,482 | B2* | 3/2020 | Heugel | B29C 64/165 |
| 2008/0030715 | A1* | 2/2008 | Kondo | G03F 9/7026 |
| | | | | 356/73 |
| 2009/0068376 | A1* | 3/2009 | Philippi | B29C 64/153 |
| | | | | 427/532 |
| 2016/0003610 | A1* | 1/2016 | Lampert | G01B 11/24 |
| | | | | 356/4.01 |
| 2016/0082668 | A1* | 3/2016 | Perret | B22F 3/1055 |
| | | | | 264/406 |
| 2016/0236279 | A1 | 8/2016 | Ashton et al. | |
| 2016/0263704 | A1 | 9/2016 | Schwarze et al. | |
| 2018/0093416 | A1* | 4/2018 | Prexler | B33Y 10/00 |
| 2018/0264552 | A1* | 9/2018 | Herzog | B23K 26/34 |
| 2018/0297116 | A1* | 10/2018 | Brunhuber | C04B 35/64 |
| 2018/0326482 | A1* | 11/2018 | Sasaki | B22F 3/16 |
| 2018/0370146 | A1* | 12/2018 | Domrose | B29C 64/153 |
| 2019/0022932 | A1* | 1/2019 | Stammberger | B29C 64/264 |
| 2019/0039319 | A1* | 2/2019 | Bechmann | B22F 3/1055 |
| 2019/0047276 | A1* | 2/2019 | Schodel | B22F 3/1055 |
| 2019/0054569 | A1* | 2/2019 | Winiarski | B22F 3/1055 |
| 2019/0060999 | A1* | 2/2019 | Zeulner | B29C 64/153 |
| 2019/0084233 | A1* | 3/2019 | Pilzweger | B29C 64/268 |
| 2019/0111623 | A1* | 4/2019 | Schodel | B33Y 30/00 |
| 2019/0111673 | A1* | 4/2019 | Pilzweger | B33Y 10/00 |
| 2019/0118482 | A1* | 4/2019 | Braunroth | B29C 64/393 |
| 2019/0152157 | A1* | 5/2019 | Braunroth | B29C 64/153 |
| 2019/0176396 | A1* | 6/2019 | Bokkes | B29C 64/286 |
| 2019/0210291 | A1* | 7/2019 | Reichenbacher | B29C 64/393 |
| 2019/0224750 | A1* | 7/2019 | Dohler | B33Y 50/02 |
| 2020/0061925 | A1* | 2/2020 | Klau ner | C04B 35/653 |
| 2020/0215760 | A1* | 7/2020 | Wijn | B29C 64/135 |

FOREIGN PATENT DOCUMENTS

| | | |
|---|---|---|
| DE | 102016200043 A1 | 7/2017 |
| DE | 102016200043 A1 | 7/2017 |
| JP | 2000/238137 A | 9/2000 |

OTHER PUBLICATIONS

European Search Report Corresponding to Application No. 17182638 dated Jan. 18, 2018.
Machine Translated Japanese Office Action Corresponding to Application No. 2017230368 dated Sep. 13, 2018.
Machine Translated Japanese Office Action Corresponding to Application No. 2017230368 dated Feb. 22, 2019.
Machine Translated Chinese Search Report Corresponding to Application No. 2017111437951 dated Mar. 17, 2020.
Machine Translated Chinese Office Action Corresponding to Application No. 2017111437951 dated Mar. 27, 2020.

* cited by examiner

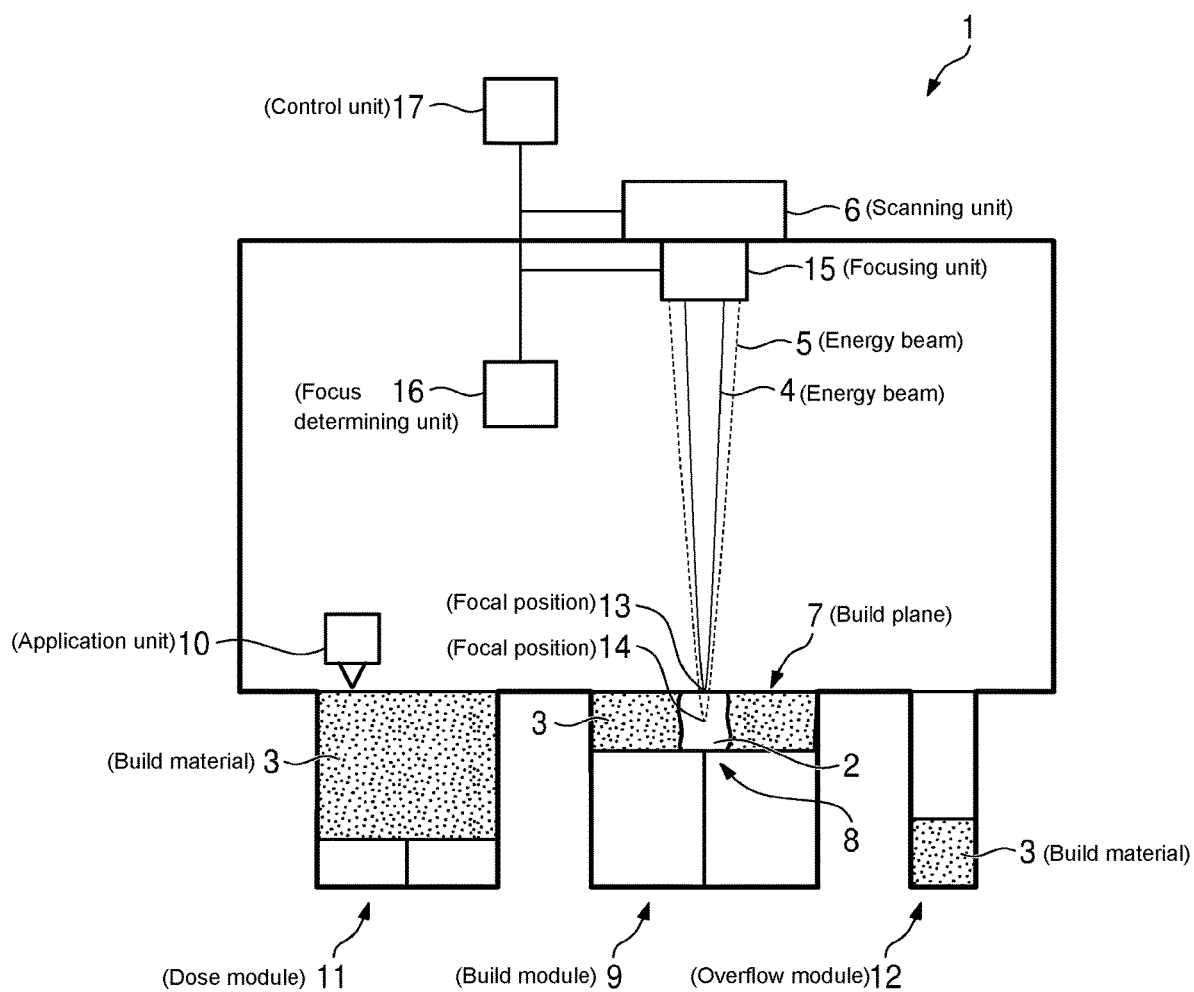

APPARATUS FOR ADDITIVELY MANUFACTURING OF THREE-DIMENSIONAL OBJECTS

CROSS-REFERENCE TO RELATED APPLICATIONS

This application claims priority to European Patent Application serial no. 17 182 638.1 filed Jul. 21, 2017, the contents of which is incorporated herein by reference in its entirety as if set forth verbatim.

The invention refers to an apparatus for additively manufacturing of three-dimensional objects by means of successive layerwise selective irradiation and consolidation of layers of a build material which can be consolidated by means of an energy beam, wherein the apparatus comprises a scanning unit configured to scan the energy beam over at least a part of a build plane.

Such apparatuses are well-known from prior art, wherein an energy beam, for example a laser beam or an electron beam, is used to selectively irradiate and consolidate regions of layers of a build material. Thus, an object can be manufactured by selectively and successively irradiating layers of the build material. To perform an selective irradiation of preselected regions of the respective layers of the build material typically, a scanning unit is provided that is configured to scan the energy beam over at least a part of the build plane. A build plane in the course of this application is a plane in which the build material is arranged and can be irradiated and consolidated by the energy beam.

To assure that the energy beam can be scanned over the build plane and is focused in a predefined focal position or with a predefined focus (or defocus) a calibration of the focal position of the energy beam is necessary. Typically, a carrying unit carrying the build material, in particular the build material that lies in the build plane, is movable in z-direction, i.e. upwards and downwards. To find an optimal focal position of the energy beam, wherein the energy beam is focused in the build plane a calibration routine is performed, wherein a plurality of patterns is irradiated by the energy beam with the carrying unit arranged in different corresponding z-positions. Subsequently, the patterns irradiated in different z-directions are compared and the pattern with the best focal position is evaluated to determine the z-position of the build plane the corresponding pattern has been irradiated in.

It is an object to the present invention to provide an apparatus for additively manufacturing of three-dimensional objects, wherein the calibration of the energy beam is improved.

The invention is based on the idea that a focusing unit is provided that is configured to control a focal position of the energy beam via a positioning of at least one optical component of the focusing unit and/or a positioning of the focusing unit relative to the build plane. By way of the invention it has been recognized that additional to or instead of calibrating the focal position of the energy beam by moving the build plane it is advantageous to use a focusing unit to control the focal position of the energy beam. Therefore, the build plane can remain in place throughout the calibration routine since the change in focal position is or can be performed solely by the focusing unit. The focusing unit comprises at least one optical component, wherein the focal position of the energy beam can be altered via a positioning of the at least one optical component relative to the build plane or via a positioning of the focusing unit as such relative to the build plane, wherein the position of the optical component inside the focusing unit may remain in constant.

Thus, throughout the calibration routine at least two (or a plurality of) exposures can be made with the focusing unit or the optical component of the focusing unit in different positions, in particular in different z-positions. As an optical component of the focusing unit in the course of this application every optical component may be used that is configured to change the vergence (degree of convergence or divergence) of the energy beam, i.e. whether the energy beam is convergent or divergent. Therefore, an arbitrary optical component can be used such as a (electromagnetic) lenses or a (adjustable) mirrors, for instance. Hence, it is not necessary to move the build plane into the focal position of the energy beam but to move the focal position of the energy beam into the build plane so that the build material in the build plane can be irradiated with a defined focus (or defocus).

The apparatus described herein is an apparatus for additively manufacturing three-dimensional objects, e.g. technical components, by means of successive layerwise selective irradiation and consolidation of layers of a powdered build material ("build material") which can be consolidated by means of an energy beam. A respective build material can be a metal, ceramic or polymer powder. A respective energy beam can be a laser beam or an electronic beam. A respective apparatus can be a selective laser sintering apparatus, a selective laser melting apparatus or a selective electron beam melting apparatus, for instance.

The apparatus comprises a number of functional units which are used during its operation. Exemplary functional units are a process chamber, an irradiation device which is configured to selectively irradiate a build material layer disposed in the process chamber with at least one energy beam, and a stream generating device which is configured to generate a gaseous fluid stream at least partly streaming through the process chamber with given streaming properties, e.g. a given streaming profile, streaming velocity, etc. The gaseous fluid stream is capable of being charged with non-consolidated particulate build material, particularly smoke or smoke residues generated during operation of the apparatus, while streaming through the process chamber. The gaseous fluid stream is typically inert, i.e. typically a stream of an inert gas, e.g. argon, nitrogen, carbon dioxide, etc.

According to a first embodiment of the apparatus an energy beam source and/or the focusing unit is associated with at least one calibration means configured to change the focal position of the energy beam with respect to a defined point of the build module, in particular inside a build chamber, of the apparatus. Therefore, a change of focal position by means of the focusing unit can be used in combination with known calibration methods, such as calibrating the position of the scanning unit or the focusing unit, for example via adjustment screws.

It is particularly preferred that the focusing unit comprises at least one optical lens or a lens system. Via the lens or the lens system it is made possible, to change the focal position of the energy beam. Therefore, the lens or a lens of the lens system is movable relative to the focusing unit, i.e. relative to the build plane. By varying the optical path length of the energy beam from the lens or a lens of the lens system from the build plane the focal position of the energy beam can be altered. Hence, moving the build plane in the calibration routine and can be omitted, since the focal position of the energy beam is changed instead of the position of the build plane.

According to a preferred embodiment of the apparatus a control unit is provided that is configured to control the focusing unit and/or scanning unit, wherein the control unit is configured to receive calibration information of at least one focus determining unit. According to this embodiment the focus or the focal position of the energy beam can be determined via a focus determining unit, for example via an optical sensor, in particular a camera recording an exposure pattern on the build plane. Dependent on the information determined by the focus determining unit and received by the control unit the focal position of the energy beam and can be controlled.

Further, a focus shift is deliverable to the control unit defining an offset of the focal position or a focal length. Thus, a focus shift can be defined that allows for adding an offset to the focal position of the energy beam or a focal length of at least one optical component of the focusing unit. This allows for selectively irradiating layers of build material with a defined defocus so that a defined energy entry into the irradiated regions of the layer of build material can be achieved.

Besides the invention relates to a method for calibrating an apparatus for additively manufacturing of three-dimensional objects by means of successive layerwise selective irradiation and consolidation of layers of a build material which can be consolidated by means of an energy beam, wherein a focal position of the energy beam is controlled. Deviant from calibrating methods that are known from prior art the focal position of the energy beam is controlled, instead of varying the position of the build plane, i.e. the position of a carrying element while the focal position of the energy beam remains constant.

Self-evidently, all details, features and advantages described with respect to the apparatus are transferable to the inventive method and vice versa. The inventive method can preferably be used to calibrate an inventive apparatus as described above.

Particularly preferred, the method for calibrating an apparatus for additively manufacturing of three-dimensional objects comprises the following steps:
 determining a current focal position of the energy beam
 determining a target focal position
 determining a current defocus with respect to the target focal position
 controlling a parameter of at least one optical component, in particular a distance of the component to the build plane, to transfer the current focal position into the target focal position According to this embodiment at first a current focal position of the energy beam is determined. The focal position can for example be measured via a focal position determining unit, in particular a photo sensor, for example a camera. Afterwards, a target focal position is determined which depends on the current build job, in particular the current region of a layer that has to be irradiated.

With the current focal position and the target focal position determined a current defocus with respect to the target focal position is evaluated. Subsequently a parameter of at least one optical component is controlled to transfer the current focal position into the target focal position. The parameter can for example be a distance of the component from the build plane, wherein the focal position of the energy beam is altered by varying the distance of the optical active component from the build plane. It is also possible, to change a focal length of at least one optical component, for example the focal length of an adjustable mirror.

Exemplary embodiments of the invention are described with reference to the FIGURE, whereby the sole FIGURE shows a principle drawing of an apparatus for additively manufacturing three-dimensional objects according to an exemplary embodiment.

The sole FIGURE shows an apparatus 1 for additively manufacturing of three-dimensional objects 2 by means of successive layerwise selective irradiation and consolidation of layers of a build material 3 which can be consolidated by means of an energy beam 4, 5, wherein the apparatus 1 comprises a scanning unit 6 configured to scan the energy beam 4, 5 over a build plane 7. The build plane 7 is the upper surface of the build material 3 carried by a carrying element 8 inside a build module 9 of the apparatus 1. After a layer of build material 3 has been irradiated by the energy beam 4, 5 fresh build material 3 can be conveyed via an application unit 10, for example a coater, from a dose module 11 to the build plane 7. The apparatus 1 further comprises an overflow module 12 that receives surplus build material 3 that is conveyed via the application unit 10.

Further, the FIGURE depicts an energy beam 4, 5, wherein a first calibration of the energy beam is provided with the reference sign 4 whereby a focal position 13 lies in the build plane 7. The energy beam 4 therefore, is focused on the build plane 7. The FIGURE also depicts an uncalibrated energy beam provided with the reference sign 5, wherein a focal position 14 of the energy beam 5 lies beneath the build plane 7 so that the energy beam 5 is defocused with respect to the build plane 7.

To calibrate the energy beam 5 a focusing unit 15 is provided that is configured to control the focal position 14 of the energy beams 5 to transfer the focal position 14 into the focal position 13 so that the calibrated energy beam 4 results. Further, it is possible, to add a defined defocus and therefore shift the focal position 13, 14 of the energy beams 4, 5 to a defined offset position.

The apparatus 1 further comprises a focus determining unit 16 that is configured to generate calibration information relating to a focus or a defocus of the energy beam 4, 5 and/or a focal position 13, 14 of the energy beam 4, 5. The calibration information can be sent to or received by a control unit 17, respectively, that is configured to control the focusing unit 15 and the scanning unit 6 to control the energy beam 4, 5, in particular a position of the energy beam 4, 5 on the build plane 7 and the focal position 13, 14.

The focal position 13, 14 can be controlled via the focusing unit 15 in that an optical component (not shown) of the focusing unit 15 is positioned relative to the build plane 7 and/or the focusing unit 15 is positioned relative to the build plane 7.

The invention claimed is:

1. An apparatus for additively manufacturing three-dimensional objects, the apparatus comprising:
 a scanner configured to scan an energy beam over at least a portion of a build plane defined by a layer of powdered build material; and
 a focusing unit comprising an optical lens or lens system, the focusing unit configured to control a focal position of the energy beam based at least in part on calibration information, at least in part to cause a defined defocus of the energy beam with respect to a target focal position, the defined defocus selected to impart a defined energy entry into one or more irradiated regions of the layer of powdered build material, the focal position controlled by moving the focusing unit in the z-direction relative to the build plane without changing the focal length of the energy beam;

wherein the energy beam is configured to irradiate and consolidate successive layers of powdered build material to form an additively manufactured three-dimensional object.

2. The apparatus of claim 1, comprising:
a build module;
wherein the focusing unit is configured to move in the z-direction relative to the built plane so as to change the focal position of the energy beam with respect to a defined point of the build module.

3. The apparatus of claim 2, wherein the build module comprises a carrying unit configured to carry the powdered build material.

4. The apparatus of claim 3, wherein the apparatus is configured to perform a calibration, the calibration comprising irradiating a plurality of patterns by the energy beam with the carrying unit arranged in different corresponding z-positions.

5. The apparatus of claim 1, wherein the focusing unit is configured to move a distance in the z-direction corresponding to a focus shift, the focus shift defining an offset of the focal position in the z-direction relative to the build plane based at least in part on the calibration information.

6. The apparatus of claim 1, comprising:
a focus determining unit, the focus determining unit configured to determine the calibration information.

7. The apparatus of claim 6, wherein the calibration information relates to a focus or a defocus of the energy beam and/or a focal position of the energy beam.

8. The apparatus of claim 1, wherein the apparatus is configured to perform a calibration of the energy beam with a focal position of the energy beam focused on the build plane.

9. The apparatus of claim 1, wherein the apparatus is configured to shift the focal position of the energy beam to a defined offset position, the defined offset position corresponding to the define defocus of the energy beam with respect to the target focal position.

10. The apparatus of claim 1, wherein the scanner is configured to control a position of the energy beam on the build plane and the focal position of the energy beam.

11. A method of calibrating an apparatus for additively manufacturing three-dimensional objects, the method comprising:
moving a focusing unit comprising an optical lens or lens system in the z-direction relative to a build plane based at least in part on calibration information and scanning an energy beam over at least a portion of the build plane using a scanner, the build plane defined by a layer of powdered build material;
controlling a focal position of the energy beam with the focusing unit without changing the focal length of the energy beam at least in part to cause a defined defocus of the energy beam with respect to a target focal position, the defined defocus selected to impart a defined energy entry into one or more irradiated regions of the layer of powdered build material;
wherein the energy beam is configured to irradiate and consolidate successive layers of powdered build material to form an additively manufactured three-dimensional object.

12. The method of claim 11, comprising:
determining a current focal position of the energy beam;
determining a target focal position of the energy beam;
moving the focusing unit in the z-direction relative to the build plane without changing the focal length of the energy beam so as to locate the focal position of the energy beam at the target focal position of the energy beam.

13. The method of claim 11, comprising:
determining a current defocus of the energy beam;
determining a target defocus of the energy beam;
determining a target focal position of the energy beam, the target focal position of the energy beam including an adjustment corresponding to the target defocus of the energy beam;
moving the focusing unit in the z-direction relative to the build plane without changing the focal length of the energy beam so as to locate the focal position of the energy beam at the target focal position of the energy beam including the adjustment corresponding to the target defocus of the energy beam.

14. The method of claim 11, comprising calibrating the focal position of the energy beam.

15. The method of claim 14, wherein calibrating the focal position of the energy beam comprises irradiating a plurality of patterns by the energy beam with a carrying unit of a build module arranged in different corresponding z-positions, the carrying unit configured to carry the powdered build material.

16. The method of claim 11, comprising:
determining the calibration information with a focus determining unit.

17. The method of claim 11, wherein the calibration information relates to a focus or a defocus of the energy beam and/or a focal position of the energy beam.

18. The method of claim 11, comprising:
calibrating the energy beam with a focal position of the energy beam focused on the build plane.

19. The method of claim 11, comprising:
shifting the focal position of the energy beam to a defined offset position, the defined offset position corresponding to the define defocus of the energy beam with respect to the target focal position.

* * * * *